United States Patent
Havemann

(12) 
(10) Patent No.: US 6,248,638 B1
(45) Date of Patent: Jun. 19, 2001

(54) ENHANCEMENTS TO POLYSILICON GATE

(75) Inventor: Robert H. Havemann, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/262,512

(22) Filed: Mar. 4, 1999

Related U.S. Application Data

(62) Division of application No. 09/216,214, filed on Dec. 18, 1998.

(51) Int. Cl.$^7$ .............................................. H01L 21/3205
(52) U.S. Cl. .......................................... 438/305; 438/592
(58) Field of Search ............................... 438/304, 305, 438/597, 682, 592

(56) References Cited

U.S. PATENT DOCUMENTS

| | | | |
|---|---|---|---|
| 4,716,131 | * | 12/1987 | Okazawa et al. . |
| 4,727,038 | * | 2/1988 | Watabe et al. . |
| 4,954,867 | * | 9/1990 | Hosaka . |
| 5,032,535 | * | 7/1991 | Kamijo et al. . |
| 5,146,291 | * | 9/1992 | Watabe et al. . |
| 5,196,360 | * | 3/1993 | Doan et al. . |
| 5,217,913 | * | 6/1993 | Watabe et al. . |
| 5,227,320 | * | 7/1993 | Johnson et al. . |
| 5,254,490 | * | 10/1993 | Kondo . |
| 5,306,655 | * | 4/1994 | Kurimoto . |
| 5,395,785 | * | 3/1995 | Nguyen et al. . |
| 5,439,846 | * | 8/1995 | Nguyen et al. . |
| 5,501,995 | * | 3/1996 | Shin et al. . |
| 5,599,741 | * | 2/1997 | Matsumoto et al. . |
| 5,736,455 | * | 4/1998 | Iyer et al. ............................ 438/592 |
| 5,834,809 | * | 11/1998 | Kato et al. . |
| 5,841,174 | * | 11/1998 | Arai . |
| 6,097,070 | * | 8/2000 | Mandelman et al. . |

FOREIGN PATENT DOCUMENTS 4-42938 * 2/1992 (JP) .

OTHER PUBLICATIONS

Pfiester et al, "Reverse elevated source/drain (RESD) MOSFET for deep submicron CMOS," IEDM IEEE pp. 885–888 (1992).*

* cited by examiner

Primary Examiner—Richard Booth
(74) Attorney, Agent, or Firm—Wade James Brady, III; Frederick J. Telecky, Jr.

(57) ABSTRACT

The conductivity of gate structures can be improved by siliciding the entire gate. Additionally, silicon sidewalls can be added to the gate after the "smiling" oxidation, but before silicidation, which provides a new tool for drain profile engineering.

10 Claims, 3 Drawing Sheets

ENHANCEMENTS TO POLYSILICON GATE

This is a Divisional application Ser. No. 09/216,214, filed Dec. 18, 1998.

BACKGROUND AND SUMMARY OF THE INVENTION

The present invention relates to integrated circuit structures and fabrication methods, especially to silicided polysilicon gates.

Background: Gate Resistance

Even as the size of integrated circuits shrinks, the demand for higher performance, including decreased resistance on conductive lines, increases. In logic integrated circuits, polysilicon gate lines commonly use a self-aligned metal silicide, such as titanium silicide, to reduce gate resistance and gate propagation delay. As device sizes shrink, smaller gate sizes mean that there are fewer nucleation centers for the transformation of titanium disilicide from a high resistance state (C49) to a low resistance state (C54), giving less desirable results. Further background in silicided gate structures can be found in Silicon *Processing for the VLSI Era,* Wolf et al., 1986 (see especially Volume 1, Chapter 11 on "Refractory Metals and Their Silicides in VLSI Fabrication" and Volume 2, Chapter 3 on "Contact Technology and Local Interconnects for VLSI"), which is hereby incorporated by reference.

U.S. Pat. No. 5,196,360 (Doan et al.) shows a previous method of forming a silicide on a gate structure. This patent discloses a polysilicon gate with dielectric sidewalls which "extend vertically upward from the source an [sic] drain regions . . . to somewhat below the uppermost surface of the gate electrode region". Although this will leave a small portion of the gate sidewall exposed for silicidation, the process shown uses sputter deposition (PVD) to deposit the metal layer which will be converted into a silicide. Since sputter deposition gives very poor step coverage, this method would not give effective silicide coverage on the sidewalls of the gate. Furthermore, this patent appears to view silicide growth on the sidewalls of the gate as a problem which must be dealt with, rather than a desirable effect.

A commonly owned application (provisional No. 60/045,178, filed Apr. 30, 1997) describes a process in which the height of the sidewall spacers is reduced, so that metal can be deposited along a significant height of the sidewalls for the gate, as well as on top of the gates. In the prior application, this is suggested as a way of reducing the total resistance of a gate line, by in effect reducing the average resistivity of the material, and by changing the overall line-to-phase ratio of the gate pattern, but this prior application still uses gate sidewalls to provide separation between the silicide layer on the gate structure and the silicide on the conductive part of the source/drain regions.

Background: Drain Profile Engineering

One of the long-standing problems in small field effect transistors is hot carrier effects. When a conventional MOS transistor structure is scaled down to one micron or less, the potential energy of an electron changes dramatically when it hits the N+drain boundaries. This sudden change in potential energy in a short distance creates a high electric field. This is undesirable because it causes the electrons to behave differently within the semiconductor lattice. Electrons which have been activated by high electric fields are referred to as "hot electrons", and can, for example, penetrate into or through the gate dielectric. Electrons which penetrate into, but not through, the gate dielectric can cause the gate dielectrics to become charged up over time. Thus, the behavior of the transistor will gradually shift in the field, until the transistor may fail in service. This is extremely undesirable. Holes are also subject to the effects of a high electric field, although this is usually not quite as great a concern with holes, due to their higher effective mass in silicon.

To avoid hot carrier effects, several techniques have been proposed. One of these techniques is lightly doped drain extension regions, or "LDD" regions. In this structure, which is now used in most small-dimension transistors, a first light and shallow implant is performed before sidewall spacers are formed on the gate structure. After the sidewall spacers are in place; a second heavier implant is performed. The first implant provides only a relatively low conductivity in the silicon, so that the voltage has a significant gradient across the LDD region. This prevents the voltage difference, between channel and drain, from appearing entirely at the drain boundary. By increasing the distance over which this voltage difference occurs, the peak electric field is reduced, and this tends to reduce channel hot carrier (CHC) effects. Another conventional technique which has been used is the "double doped drain." In this technique, the drain is implanted with both phosphorus and arsenic (or alternatively with both phosphorus and antimony.) Phosphorus diffuses faster, at a given temperature, than arsenic, and thus produces a slightly "fuzzy" drain profile. Again, this has the effect of stretching the voltage change at the drain boundaries, and this reduces the peak electric field, as is desirable.

Another common technique, which is not done primarily for reasons of drain profiling, but which has some influence on this, is the "smiling" oxidation. After a gate structure has been formed, a further oxidation is commonly performed, to widen the oxide thickness at the lower corners of the gate. This has the effect of slightly increasing the separation between the lower corners of the gate and the silicon substrate. This is desirable, since the electric field is slightly higher at the gate corners, due to geometric effects. This is usually done, however, primarily to compensate for any damage to the gate dielectric at the lower gate corners which may be caused by etching processes.

Enhancements to Gate Conductivity and Drain Profile Engineering

The present application provides several innovations which are aimed at optimizing the conductivity of gate structures, and also provide new tools for drain profiles engineering.

Preferably, in one embodiment of the disclosed method, an oxidation resistant sidewall layer is applied to the gate structure, to permit a "smiling" oxidation be performed to elevate the corners of the gate structure. The sidewalls of the gate are then exposed and a metal for siliciding is deposited overall, after which source/drain implants are performed. Optionally, additional source/drain implants can be performed prior to metal deposition. After an implant has been done through the metal, an annealing step is applied, to cause silicidation, and also to activate the implant into the source/drain regions. The unreacted metal is then stripped, providing a polysilicon gate which is heavily coated with silicide. If desired, additional dielectric sidewall layers can be added onto the silicide sidewalls after the metal is stripped, to assure a safe offset between the silicide and the drain siliciding. If desired, the source/drains can be silicided separately from the gates, to provide, e.g., two different silicide compositions on the source/drains and on the gates.

Preferably, in another embodiment of the disclosed method, after a smiling oxidation is performed and the nitride sidewalls removed, the sidewalls of the gate structure are extended by a conformal polysilicon deposition. Thus, the location of the smiling oxidation does not have to be aligned to the corners of the gate, as has conventionally been desired. This -opens up a new range of options in drain profile engineering. The gate-induced electric field can be removed from the drain region, by an amount which is independent of the separation between N+ and N− (or alternatively P+ and P−) diffusions.

Advantages of the disclosed methods and structures include:
increased gate conductivity;
additional control over gate corner profiles;
additional control over gate electric fields;
additional control over silicided gate structures;
additional control over the line-to-space ratio of the gate pattern; and
uses conventional processes.

BRIEF DESCRIPTION OF THE DRAWINGS

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Presently Preferred Embodiment

Figure 1:
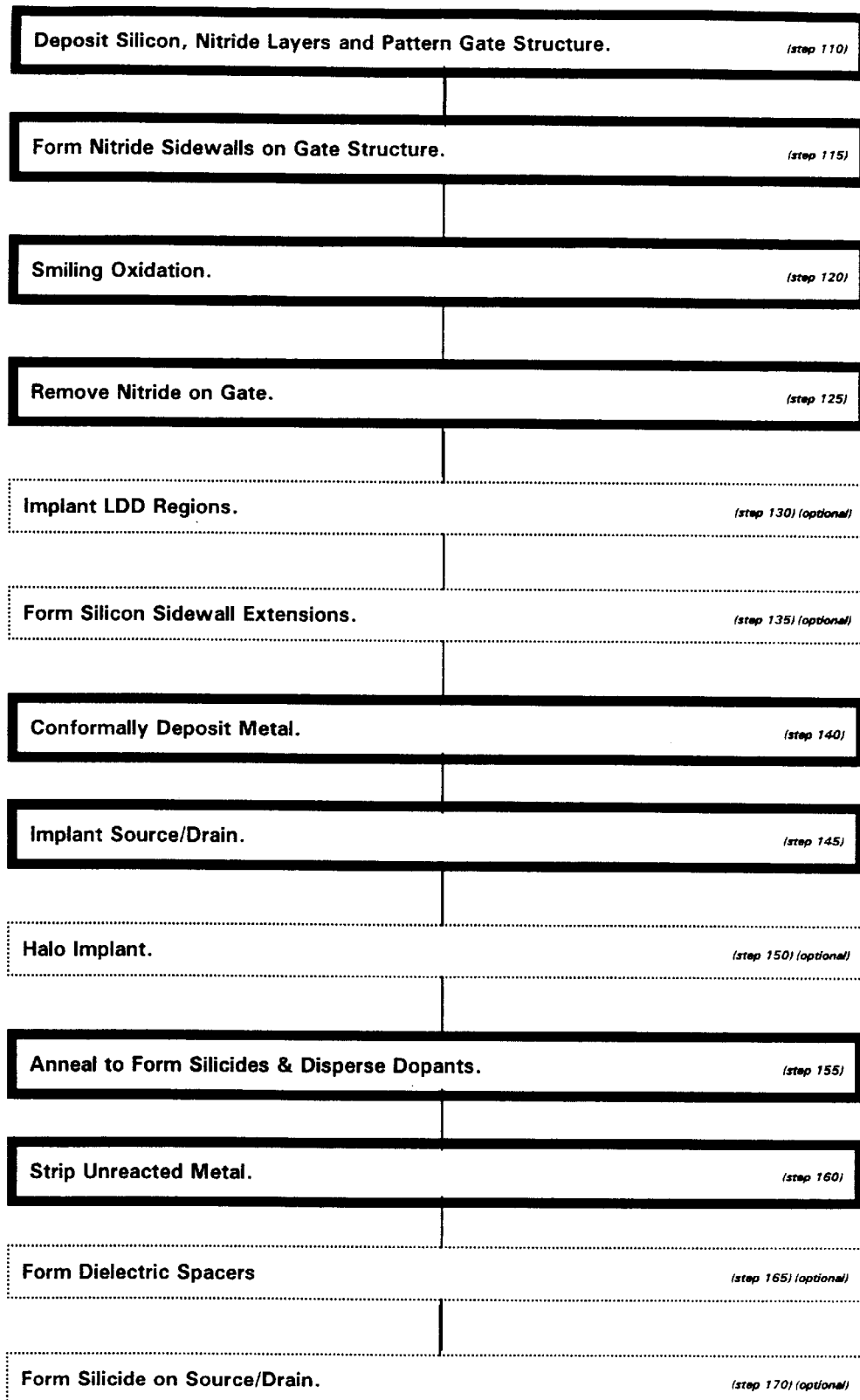
FIG. 1 is a flowchart of the disclosed process.

A first embodiment of the disclosed process is shown in the flowchart of FIG. 1, a discussion of which follows in conjunction with FIGS. 2A–E.

After isolation structures and a gate dielectric 10 (e.g. 5 nm of grown silicon oxide) are formed, a layer of polysilicon 20 is deposited over the dielectric. This is followed by formation of a thin layer of oxide (not shown) and deposition of a layer of nitride 30, then the layers are patterned to form a gate structure (step 110).

Figure 2A:
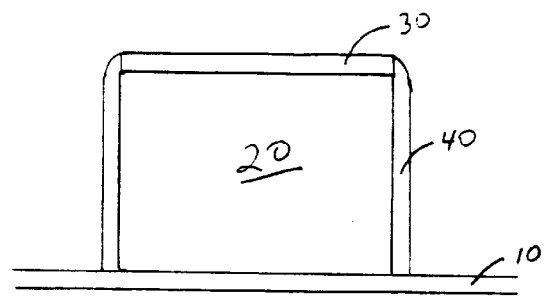
FIGS. 2A–2E show a partially fabricated gate structure, at various steps in the fabrication of the disclosed embodiments.
Figure 2B:
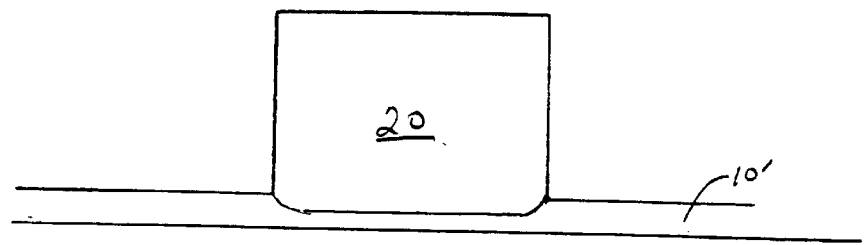
Figure 2C:
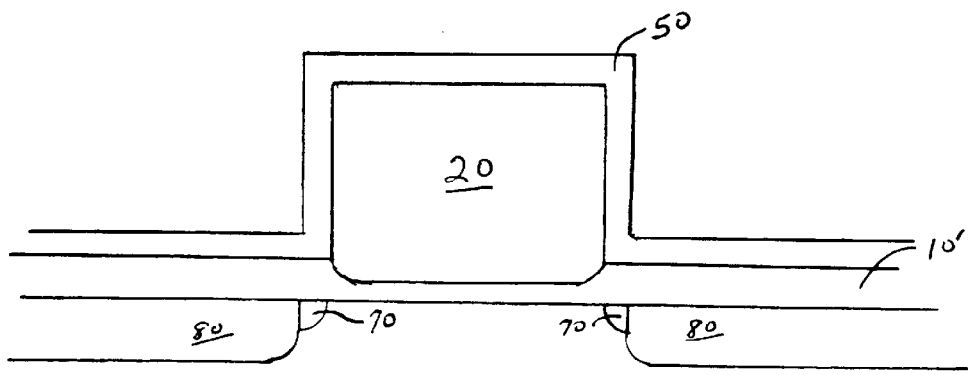
Figure 2D:
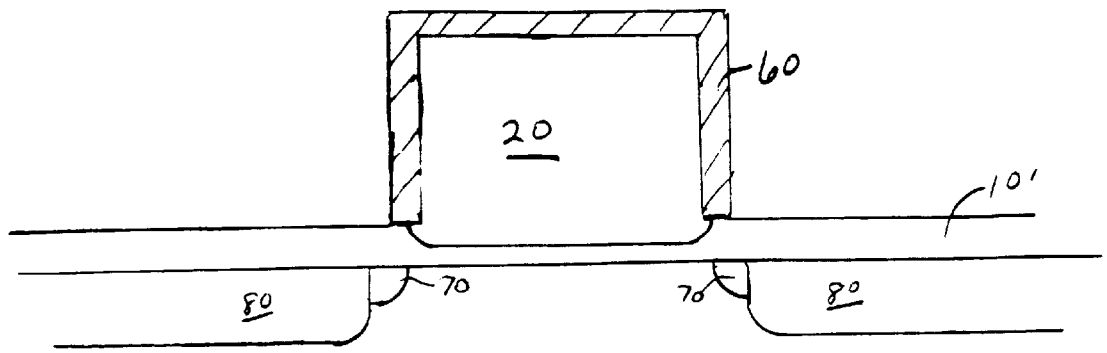

A second layer of nitride is then deposited overall and etched (step 115) to form gate sidewall spacers 40, giving the structure of FIG. 2A. Note that the original layer of nitride 30 on top of the gate must be thick enough to withstand the overetch necessary to form the spacers. Once the gate is covered with nitride, an oxidation is performed (step 120), which makes the gate oxide 10' wider under the gate corners than it is near the center of the gate. This is often called a "smiling oxidation", due to the creation of upturned corners in the oxide; after it is completed, the nitride layer is removed (step 125), giving a structure such as is shown in FIG. 2B.

Lightly-doped-drain extension regions (LDD regions 70) are then formed (step 130) by implantation of the exposed active area. This is followed by conformal deposition (step 140) of a metal 50, such as 20 nm of titanium, which will be used to form a silicide. This gives the structure shown in FIG. 2C. After deposition, the source/drain areas receive their final doping, which is implanted (step 145) through the layer of metal to form regions 80. It is noted that the conformal metal on the sidewalls of the gate acts to mask that portion of the substrate from receiving this implant. An additional, optional implant (e.g., high-energy boron for an NMOS device) can be performed at this point (step 150), to form the HALO implant, if desired.

The wafer is then annealed (step 15) to form a silicide on the gate and to disperse the dopants. Note that, since the source/drain areas are covered by an oxide, a silicide will not form in these regions. Unreacted metal will be stripped (step 160) from the gate area, giving the structure shown in FIG. 2D. Dielectric spacers can optionally be formed at this point (step 165) to protect the gate from accidental contact, and the source/drain areas separately silicided (step 170). It is noted that since the gate and source/drain areas are silicided in separate steps, it is possible to use different metals to form the two suicides.

Processing can then proceed with the usual procedures to complete the wafer.

Alternate Embodiment: Timing of LDD Implant

In an alternate embodiment, the LDD regions are implanted after formation of the nitride sidewalls, but prior to the smiling oxidation. In another alternate embodiment, the LDD regions are implanted prior to the formation of the nitride sidewalls and the source/drain regions are implanted after the nitride sidewalls are formed but before metal deposition.

Alternate Embodiment: Silicon Extensions to Gate

Figure 2E:
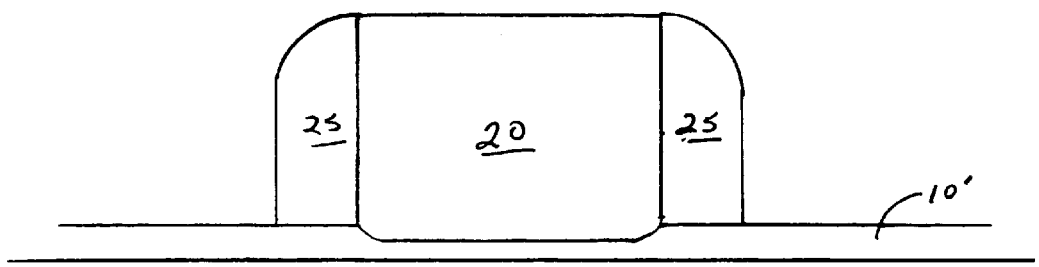

In another alternate embodiment, after the smiling oxidation and nitride removal, a layer of polysilicon or amorphous silicon is deposited and anisotropically etched (step 135) to form sidewall extensions 25 of the polysilicon gate, as shown in FIG. 2E. When this option is used, the thin oxide on top of the gate (not shown) which separates the nitride and the gate is preferably left in place to act as an etch stop for the polysilicon sidewall etch. In the case of amorphous silicon, an anneal step is preferably added to the flow if subsequent steps do not include high enough temperatures to cause the transformation to polysilicon.

Alternate Embodiment: Silicon Germanium

In another alternative embodiment, the gate structure can consist of a polycrystalline silicon germanium. Other process parameters remain the same.

Alternate Embodiment: Simultaneous Gate and S/D Silicide

In a less preferred embodiment, prior to deposition of metal in step 150, the gate oxide can be removed to allow simultaneous silicidation of the source/drain areas and the gate. In this embodiment, care must be taken to ensure that the gate silicide is not shorted to the source/drain silicides.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

While the inventions have been described with primary reference to a single-poly process, it will be readily recognized that these inventions can also be applied to process with two, three, or more layers of polysilicon or polycide.

The use of the polysilicon sidewall is not necessarily limited to a poly/gate structure. This can be advantageous for future metal/barrier/poly structures, e.g. for W/TiN/silicon structures. It may also be applied to polysilicon-free structures, such as W/TiN/SiO2 structures.

In an alternate embodiment, the disclosed "wide smile" structure, i.e. a gate that has been widened with conductive sidewalls after the "smiling" oxidation, is used without an LDD implant. Instead, a single implant is used, possibly including arsenic as well as phosphorus in the N+ implant, to provide a simpler drain structure.

What is claimed is:

1. A method for forming a transistor structure which comprises the steps of:

providing a region of semiconductor material having a gate dielectric thereover;

providing a polysilicon gate having corners and disposed over said gate dielectric said gate having a top and sidewalls;

forming a nitride layer covering said top and sidewalls of said gate and then further oxidizing said semiconductor material to increase the thickness of said gate dielectric under said corners of said gate;

then forming a lightly doped drain region in said semiconductor material using said nitride layer on said sidewalls of said gate as a mask and aligned with said nitride layer;

removing said nitride layer and forming a layer of material on said top and sidewalls of said gate capable of forming an electrically conductive silicide with the material of said gate;

then forming a silicide layer disposed on said top and sidewalls of said polysilicon gate; and forming source/drain regions in said region of semiconductor material spaced apart from each other and each disposed adjacent to and aligned with said suicide layer disposed on said sidewalls.

2. The method of claim 1 wherein said silicide layer is titanium silicide.

3. The method of claim 1 further including a lightly doped source/drain extension of each of said source/drain regions extending under said polysilicon gate.

4. The method of claim 2 further including a lightly doped source/drain extension of each of said source/drain regions extending under said polysilicon gate.

5. The method of claim 1 further including a dielectric extending from said gate dielectric of increased thickness relative to said gate dielectric and disposed under said silicide layer.

6. The method of claim 2 further including a dielectric extending from said gate dielectric of increased thickness relative to said gate dielectric and disposed under said silicide layer.

7. The method of claim 3 further including a dielectric extending from said gate dielectric of increased thickness relative to said gate dielectric and disposed under said silicide layer.

8. The method of claim 4 further including a dielectric extending from said gate dielectric of increased thickness relative to said gate dielectric and disposed under said silicide layer.

9. Therein said silicide layer extends to said gate dielectric.

10. The method of claim 5 wherein said silicide layer extends to said dielectric of increased thickness.

* * * * *